United States Patent [19]

Hodsdon et al.

[11] 4,199,204
[45] Apr. 22, 1980

[54] HOUSING FOR A TWO-WAY RADIO OR THE LIKE

[75] Inventors: Roy F. Hodsdon; Henry A. Schaefer, both of Lynchburg, Va.

[73] Assignee: General Electric Company, Lynchburg, Va.

[21] Appl. No.: 970,479

[22] Filed: Dec. 18, 1978

[51] Int. Cl.² .............................................. A47B 81/06
[52] U.S. Cl. .................................. 312/7 R; 312/108; 312/111; 312/263
[58] Field of Search ............ 312/7 R, 7 TV, 107, 312/108, 111, 100, 258, 263, 257 R, 257 SK; 339/88 R

[56] References Cited

U.S. PATENT DOCUMENTS

| | | |
|---|---|---|
| 1,546,004 | 7/1925 | Birry ................................. 312/7 R |
| 2,057,116 | 10/1936 | Rubens ............................ 312/257 R |
| 2,591,172 | 4/1952 | Lundine ............................. 312/263 |
| 2,731,555 | 1/1956 | Beck .................................... 325/15 |
| 2,746,824 | 5/1956 | Bond ................................. 312/7 R |
| 3,159,436 | 12/1964 | Davis ................................ 312/107 |
| 3,229,029 | 1/1966 | Weiss ................................ 312/263 |
| 3,779,623 | 12/1973 | Motohashi ......................... 312/111 |
| 3,807,572 | 4/1974 | Luvara et al. ...................... 312/108 |
| 3,976,344 | 8/1976 | Frydman ............................ 312/263 |
| 3,984,161 | 10/1976 | Johnson ............................ 312/7 R |
| 4,021,089 | 5/1977 | Bush ................................. 312/111 |

Primary Examiner—Victor N. Sakran
Attorney, Agent, or Firm—James J. Williams

[57] ABSTRACT

A housing for a two-way radio is formed of front and rear covers, left and right sides, a base plate, and a top control panel and cover. Certain pieces are provided with corresponding mating surfaces to aid in assembly, and the pieces are held together by screws and nuts. Selected pieces may be substituted to permit variations in internal structure and to provide different configurations without the need to change all of the other pieces.

4 Claims, 4 Drawing Figures

HOUSING FOR A TWO-WAY RADIO OR THE LIKE

BACKGROUND OF THE INVENTION

Our invention relates to a housing for a two-way radio or the like, and particularly to such a housing that is easily assembled and disassembled, and that permits parts to be substituted to provide a different structure or a different size housing.

Housings for modern radio and electronic apparatus must meet various requirements. One is that the housing must permit the radio or electronic apparatus to be easily placed in the housing, a requirement that is important because of the relatively small size and fragile nature of the apparatus.

Accordingly, a primary object of our invention is to provide a new and improved housing that permits radio and electronic apparatus to be easily placed or inserted in the housing during manufacture, and that permits the radio or electronic apparatus to be easily removed from or reached in the housing during repair.

A general object of our invention is to provide a new and improved housing for radio or electronic apparatus.

Another object of our invention is to provide a novel radio or electronic housing that can be easily and quickly assembled.

Because of the relatively fragile or delicate nature of some modern radio or electronic apparatus, another housing requirement is that the apparatus must be protected or cushioned against mechanical vibration and shock. Accordingly, another object of our invention is to provide a new and improved housing that permits the housing to be assembled around the radio apparatus with the protective material in place on the apparatus; or that permits the apparatus with the protective material to be easily placed in the housing.

Sometimes, radio or electronic apparatus in an existing housing must be modified or enlarged. Such modification or enlargement may require a change in a part but not all of the housing. Accordingly, another object of our invention is to provide a new and improved housing that comprises parts which can be replaced by other parts of different configuration so that as many of the original housing parts as possible can be used and still provide the needed change.

SUMMARY OF THE INVENTION

Briefly, these and other objects are achieved in accordance with our invention by a generally rectangular housing structure having left and right sides which are assembled with a base and a top by fitted surfaces and mechanical fasteners to form an open rectangle in which electronic or radio apparatus may be placed. Or, the sides, base, and top may be assembled around the apparatus on which protective material has been placed. Front and rear covers are placed on the assembled housing rectangle, and held in position by matching tongues and grooves, and held by mechanical fasteners between the covers. The assembled housing securely holds the apparatus, and permits access to the apparatus by removal of the front and rear covers, or by total disassembly of the housing, both of which are easy and quick. In addition, selected parts of the housing may be replaced if the housing configuration must be changed.

BRIEF DESCRIPTION OF THE DRAWING

The subject matter which we regard as our invention is particularly pointed out and distinctly claimed in the claims. The structure and operation of our invention, together with further objects and advantanges, may be better understood from the following description given in connection with the accompanying drawing, in which:

DESCRIPTION OF THE PREFERRED EMBODIMENT

Figure 1:
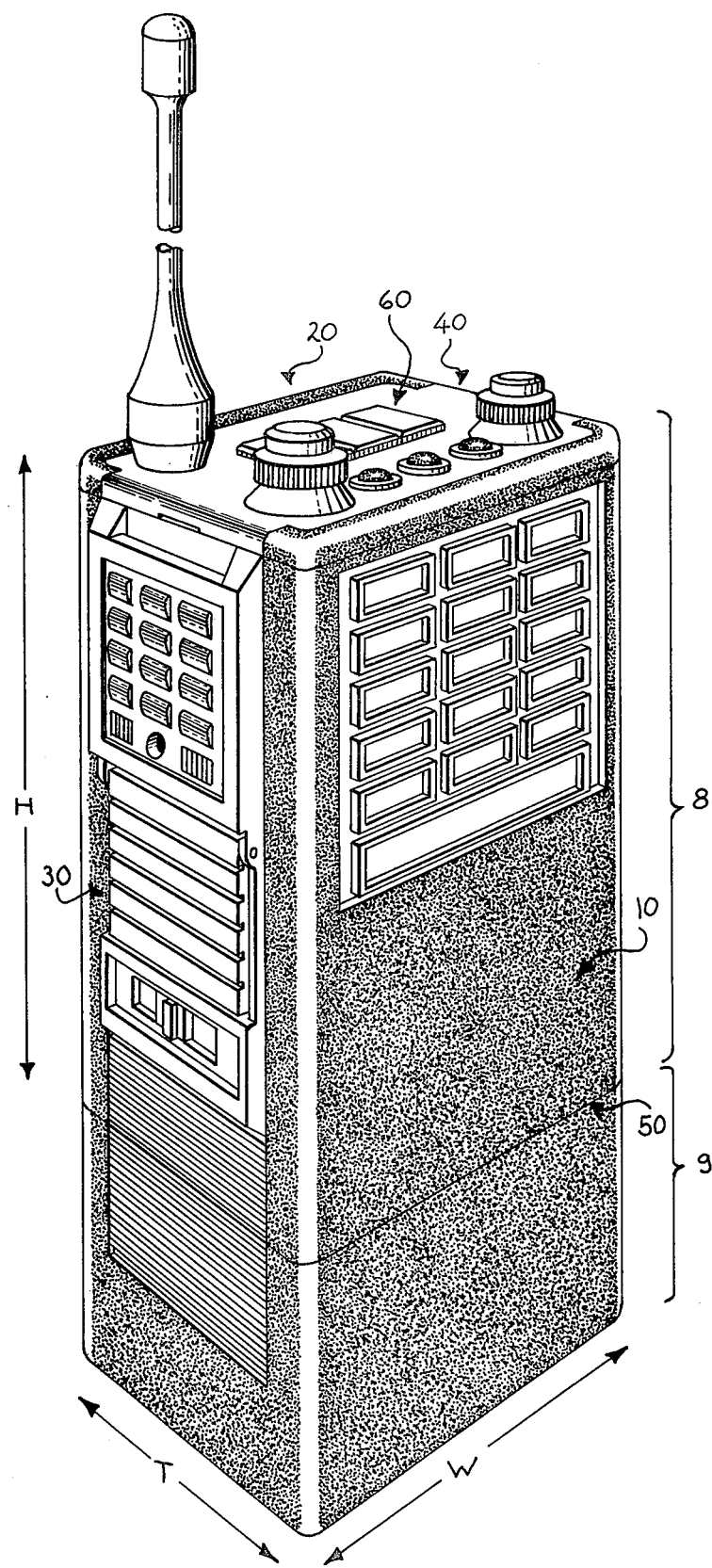
FIG. 1 shows a perspective view of a two-way radio having a housing in accordance with our invention.

FIG. 1 shows a perspective view of a two-way radio for which our improved housing is intended. However, it is to be understood that our improved housing can be used for almost any type of radio or electronic apparatus. Such a radio as shown in FIG. 1 comprises a radio portion 8 which contains a transmitter and receiver and associated electronic control equipment, and a battery portion 9 which is attached to and powers the radio portion 8. The radio portion 8 is generally rectangular in shape, and has a height dimension H, a width dimension W, and a thickness dimension T. This radio portion 8 includes a front cover 10 having a loudspeaker and microphone; a rear cover 20 which typically is a plain cover but which may have a carrying clip; a left side 30 which may include an on/off switch and other controls; a right side 40 which typically is plain; a base 50 which includes a holding or clamping structure for receiving and connecting the battery portion 9; and a top 60 which may include various control knobs and lamps, and also an antenna.

Figure 2:
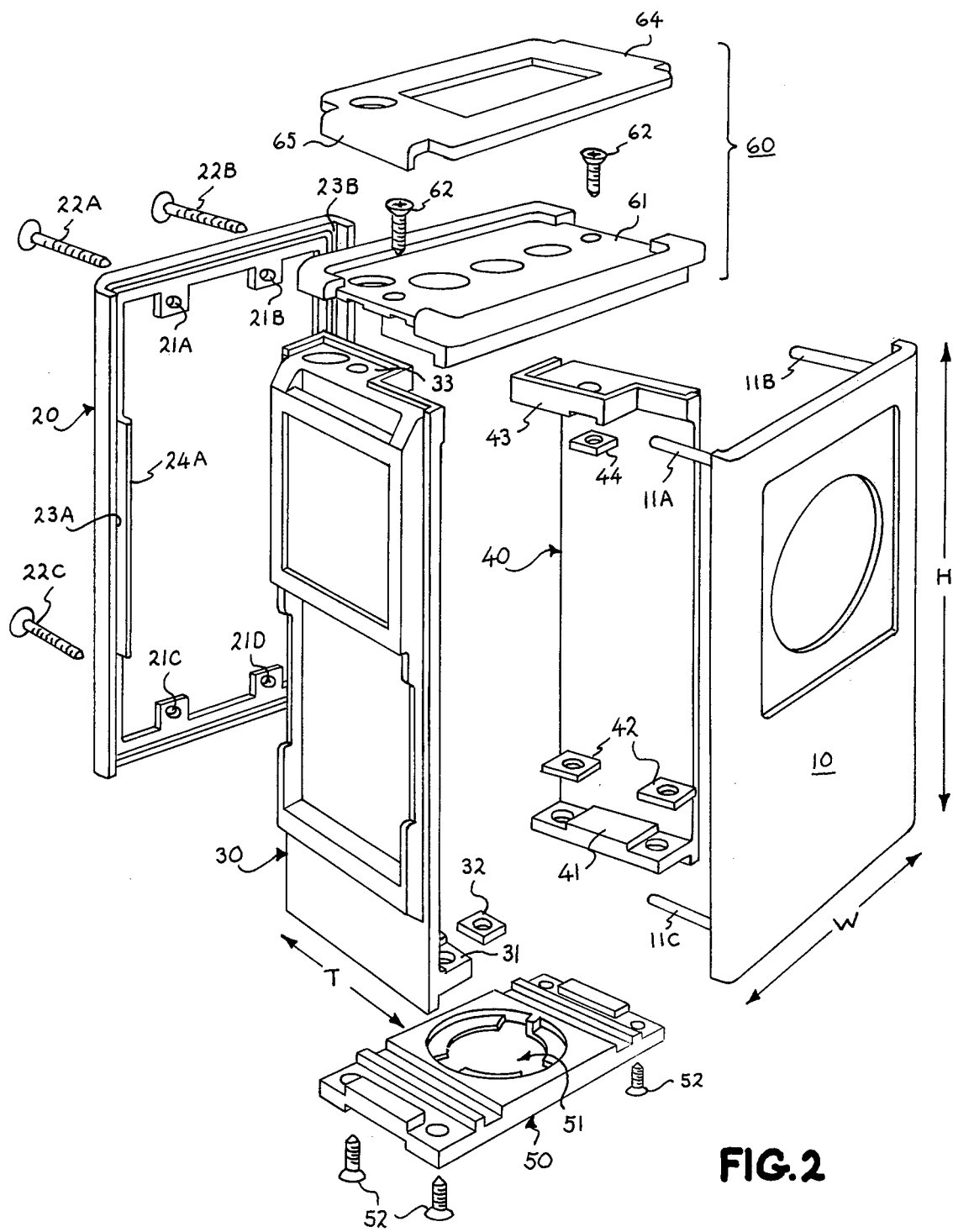
FIG. 2 shows an exploded perspective view of a housing in accordance with our invention for the radio of FIG. 1.

FIG. 2 shows an exploded perspective view of our improved housing for the radio portion 8 shown in FIG. 1. In FIG. 2, we have omitted all of the various control apparatus, the antenna, the microphone and speaker, and the internal electronic equipment and components.

The front cover 10 is a metallic plate having a width dimension W and a height dimension H, and has suitable openings and indentations for the microphone and loudspeaker. Elongated standoffs or threaded members 11A, 11B, 11C, 11D (not visible) are attached to the front cover 10 for connecting the front cover 10 to the rear cover 20. The front cover 10 is provided with grooves 13A, 13B (not visible in FIG. 2) extending along both edges of its height dimension H. These grooves face toward the rear cover 20, and are arranged to receive suitable tongues in the left and right sides 30, 40.

The rear cover 20 is a metallic plate also having a width dimension W and a height dimension H. The rear cover 20 is provided with grooves 23A, 23B which extend along both edges of its height dimension H, and which face toward the front cover 10 to receive suitable tongues on the left and right sides 30, 40. The rear cover 20 is provided with openings 21A, 21B, 21C, 21D which are respectively located to align with the members or standoffs 11A, 11B, 11C, 11D on the front cover 10. Suitable threaded screws 22A, 22B, 22C, 22D (not visible) are provided. When the housing is assembled, the screws 22A, 22B, 22C, 22D are inserted in the openings 21A, 21B, 21C, 21D to engage or thread into the members or standoffs 11A, 11B, 11C, 11D respectively.

Both covers 10, 20 have longitudinal ribs 14A, 14B, 24A, 24B which extend along the edges of their height dimensions H to provide added positioning and inside support to the sides. A rib 24A on the cover 20 can be seen in FIG. 2.

The left side 30 is preferably formed of a plate of plastic material having a thickness dimension T and a height dimension H. The left side 30 is provided with suitable shapes or tongues along both sides of its height dimensions H to engage the correspondingly located grooves on the front cover 10 and the rear cover 20. At the bottom of the left side 30, a flange 31 is provided with openings, and two threaded nuts 32 are provided to receive threaded machine screws when the bottom 50 is attached. Likewise, a flange 33 at the top of the left side 30 is provided with an opening and a threaded nut (not visible) for receiving a machine screw when the top 60 is attached.

The right side 40 is formed of a plate of plastic material having thickness dimensions T and a height dimensions H. The right side 40 is provided with suitable shapes or tongues along both edges of its height dimensions H to engage the correspondingly located grooves in the front cover 10 and the rear cover 20. The right side 40 includes a lower flange 41 with suitable openings and threaded nuts 42 for receiving threaded machine screws when the bottom 50 is assembled. At the top, the right side 40 also includes a flange 43 with an opening and a nut 44 for receiving a threaded machine screw when the top 60 is assembled.

The bottom or base 50 is formed of a metallic plate having a circular opening and configuration 51 for receiving a battery connecting member as described in U.S. Pat. No. 3,633,151 granted Jan. 4, 1972. The base or bottom 50 has a thickness dimension T and a width dimension W. The base 50 is provided with four holes through which threaded machine screws 52 pass to engage the threaded nuts 32, 42 associated with the left and right sides 30, 40. In addition, the base 50 has suitable projections and recesses which match and mate with corresponding projections and recesses on the flanges 31, 41 to aid in assembling the base 50 to the sides 30, 40.

The top 60 includes a first member 61 formed of plastic and provided with a thickness dimension T and a width dimension W. The member 61 includes suitable holes and openings for various control components and the antenna shown in FIG. 1, and further includes holes or openings for admitting machine screws 62 which pass through these holes to engage a nut associated with the flange 33 of the left side 30 and a nut 44 which is associated with the flange 43 of the right side 40. In addition, the portion 61 may include suitable projections and recesses which match and mate with corresponding projections and recesses on the flanges 33, 43 of the sides 30, 40 to aid in assembly. The top 60 further comprises a plastic snap-on member 64 which may be formed of plastic generally having a width dimension W and a thickness dimension T to provide a cover or dress plate for the top 60. The member 64 may be provided with flanges 65 on both sides that frictionally engage recesses in the left and right sides 30, 40.

Figure 3:
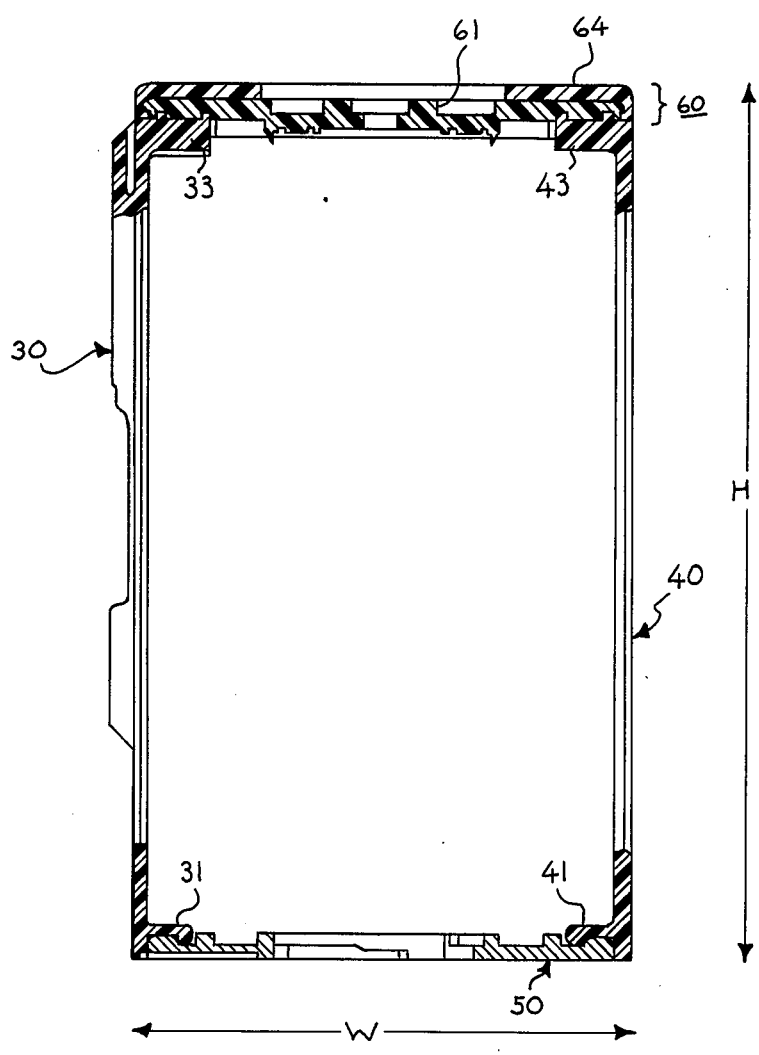
FIG. 3 shows a front view, partly in cross section, of our housing of FIGS. 1 and 2.

When our improved housing is assembled, the left and right sides 30, 40 are placed in engagement with the top portion 61 and base 50 so that the projections and recesses of these pieces fit into and partially hold these four parts together at right angles at the corners. Then, the machine screws 52, 62 are passed through their respective openings and threaded into the respective nuts 32, 42, 44 to firmly hold the two sides 30, 40, the top portion 61, and the base 50 together in a strong rectangular-like structure. This structure is shown in the cross sectional view of FIG. 3. As shown, this structure can be considered to be a four sided structure having an opening of width dimension W and height dimension H. FIG. 3 also shows the projections and recesses in the engaging surfaces of the flanges 31, 33, 41, 43 and the base 50 and top portion 61. These projections and recesses are helpful in properly assembling and holding the structure until the nuts and screws are installed. At this point in the assembly, the radio or electronic equipment may be placed inside of the structure shown in FIG. 3 and held either by padding or shock absorbing material around the outside of the apparatus, or by threaded or other types of mechanical fasteners. Or, the sides 30, 40, the base 50 and the top portion 61 may be assembled around the electronic apparatus and fastened together. Either procedure is relatively simple and rapid. The various control knobs and equipment are provided on the top portion 61, and connected to the radio or electronic apparatus.

Figure 4:
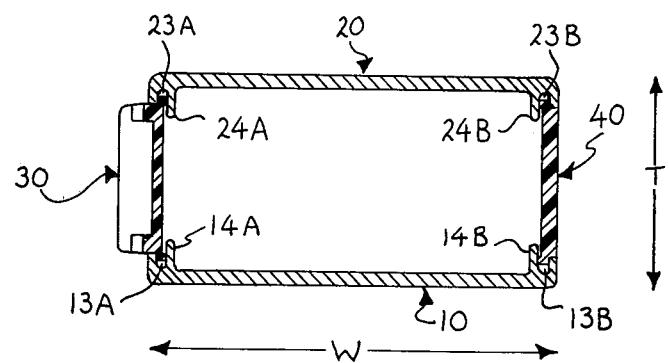
FIG. 4 shows a top cross sectional view of our housing of FIGS. 1, 2, and 3.

After the assembly of the sides 30, 40, the base 50, and the top portion 61 is completed and the electronic apparatus installed, the front cover 10 and the rear cover 20 may be placed on the assembly. These covers 10, 20 are partially held in position by the corresponding tongues and grooves which extend along the height dimensions H of the covers 10, 20 and the sides 30, 40. The members or standoffs 11A, 11B, 11C, 11D line up with the openings 21A, 21B, 21C, 21D in the rear cover 20, so that the screws 22A, 22B, 22C, 22D may be inserted and threaded into the members 11A, 11B, 11C, 11D. This fastening firmly holds the two covers 10, 20 together and provides structural rigidity and strength to the housing. FIG. 4 shows a cross sectional view of the assembled housing when looking down from the top, and in particular shows the tongues on the sides 30, 40 fitting into the grooves 13A, 13B, 23A, 23B on the covers 10, 20 along their respective edges of the height dimension H. FIG. 4 also shows the longitudinal ribs 14A, 14B, 24A, 24B of the covers 10, 20.

If the added cover 64 is provided, it may be snapped on to the top portion 61 and held by the flanges 65 which frictionally engage in suitable recesses in the left and right sides 30, 40.

It will thus be seen that we have provided a new and improved housing arrangement that is very versatile, and that makes assembly of the small, fragile radio electronic equipment relatively easy. The interlocking or mating parts (particularly the tongues, grooves, ribs, projections, and recesses) provide holding and mechanical strength to the housing so that the screws and nuts are needed only to hold the parts together. If apparatus of a different size must be provided, or if certain portions of our housing have to be changed, these changes can be made easily by providing new or different portions. For example, if other control functions must be provided in the top 60, a different portion 61 can be provided for the different control functions, and still fit and be assembled with the remainder of the housing. The same is true of the other portions of our housing. Persons skilled in the art will appreciate the many modifications that can be made to our housing arrangement.

The projections or tongues on one piece and the mating recesses or grooves on another piece can be interchanged. The exact size and configuration of each of the individual housing portions can be varied to suit individual needs or preferences. Therefore, while our invention has been described with reference to a particular embodiment, it is to be understood that modifications may be made without departing from the spirit of the invention or from the scope of the claims.

What we claim as new and desire to secure by Letters Patent of the United States is:

1. An improved housing for a two-way radio or the like having a substantially rectangular shape of selected height dimension H, selected width dimension W, and selected thickness dimension T, said housing comprising:
    a. a rectangular base plate having said width W and thickness T;
    b. a rectangular top plate having said width W and thickness T;
    c. a rectangular left side plate having said height H and thickness T, said left side having a tongue extending along at least a portion of each edge forming said height dimension H;
    d. a rectangular right side plate having said height H and thickness T, said right side plate having a tongue along at least a portion of each edge forming said height dimension H;
    e. means mechanically fastening said base plate to the lower edges of said left and right side plates so that said thickness dimensions T of said base plate edges join said lower thickness dimensions T of said left and right side plates;
    f. means mechanically fastening said top plate to the upper edges of said left and right sides so that said thickness dimensions T of said top plate edges join said upper thickness dimensions T of said left and right sides;
    g. said fastened side plates, base plate, and top plate forming a strong rectangular structure;
    h. a rectangular front cover plate having said width dimension W and height dimension H, said front cover plate having a longitudinal groove extending along at least a portion of each edge forming said height dimension H;
    i. a rectangular rear cover plate having said width dimension W and height dimension H, said rear cover plate having a longitudinal groove along at least a portion of each edge forming said height dimension H;
    j. means positioning said front cover plate against the front edges of said fastened side plates, base plate, and top plate with the tongues of said left and right side plates positioned in respective grooves of said front cover plate;
    k. means positioning said rear cover plate against the rear edges of said fastened side plates, base plate, and top plate with the tongues of said left and right side plates positioned in respective grooves of said rear cover plate;
    l. and means mechanically fastening said front cover plate to said rear cover plate to form a generally enclosed housing.

2. An improved housing assembly for a two-way radio or the like comprising:
    a. a top plate having major dimensions W and T corresponding to the width and thickness respectively of said radio;
    b. a bottom plate having major dimensions W and T corresponding to the width and thickness respectively of said radio;
    c. a left side plate having major dimensions H and T corresponding to the height and thickness respectively of said radio;
    d. a right side plate having major dimensions H and T corresponding to the height and thickness respectively of said radio;
    e. said top plate and said left and right side plates having correspondingly located mating surfaces along said dimension T;
    f. said bottom plate and said left and right side plates having correspondingly located mating surfaces along said dimension T;
    g. first mechanical means for fastening said top plate to the upper edges of said left and right side plates with said mating surfaces engaged and for fastening said bottom plate to the lower edges of said left and right side plates with said mating surfaces engaged to form a rectangular assembly;
    h. a front plate having major dimensions W and H corresponding to the width and height respectively of said radio;
    i. a rear plate having major dimensions W and H corresponding to the width and height respectively of said radio;
    j. said front plate and said left and right side plates having correspondingly located mating surfaces along said dimension H;
    k. said rear plate and said left and right side plates having correspondingly located mating surfaces along said dimension H;
    l. and second mechanical means for fastening said front plate to the front edges of said left and right side plates and to the front edges of said top and bottom plates with said mating surfaces engaged, and for fastening said rear plate to the rear edges of said left and right side plates and to the rear edges of said top and bottom plates with said mating surfaces engaged.

3. The improved housing assembly of claim 2 wherein said second mechanical means comprise means connected between said front and said rear plates.

4. The improved housing assembly of claim 2 or claim 3 wherein said each of said related mating surfaces comprise projections on one plate and correspondingly shaped recesses on the other plate.

* * * * *